US011690296B2

(12) United States Patent
Han et al.

(10) Patent No.: US 11,690,296 B2
(45) Date of Patent: Jun. 27, 2023

(54) DEFORMATION DRIVING DEVICE FOR FLEXIBLE DISPLAY PANEL, AND FLEXIBLE DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Feng Han, Beijing (CN); Ruifeng Yang, Beijing (CN); Litao Fan, Beijing (CN); Yufei Liu, Beijing (CN); Junhuan Liu, Beijing (CN); Chengrun Xu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 708 days.

(21) Appl. No.: 16/641,578

(22) PCT Filed: May 8, 2019

(86) PCT No.: PCT/CN2019/086031
§ 371 (c)(1),
(2) Date: Feb. 24, 2020

(87) PCT Pub. No.: WO2019/218914
PCT Pub. Date: Nov. 21, 2019

(65) Prior Publication Data
US 2020/0227619 A1 Jul. 16, 2020

(30) Foreign Application Priority Data
May 18, 2018 (CN) .......................... 201810478541.3

(51) Int. Cl.
G09G 3/20 (2006.01)
H10N 30/20 (2023.01)
(Continued)

(52) U.S. Cl.
CPC .............. *H10N 30/20* (2023.02); *B81B 3/00* (2013.01); *H05K 5/0017* (2013.01);
(Continued)

(58) Field of Classification Search
CPC ......... G06F 1/1652; G06F 2203/04102; G09F 9/301; G09G 2380/02; H01L 41/187; B81B 3/00; H10N 30/20
See application file for complete search history.

(56) References Cited

U.S. PATENT DOCUMENTS

| | | | |
|---|---|---|---|
| 10,885,881 B2* | 1/2021 | Jia | G09G 5/38 |
| 2014/0204509 A1* | 7/2014 | Park | F16K 31/005 361/679.01 |

(Continued)

FOREIGN PATENT DOCUMENTS

| | | |
|---|---|---|
| CN | 104620495 A | 5/2015 |
| CN | 205266977 U | 6/2016 |

(Continued)

OTHER PUBLICATIONS

The First Office Action dated May 15, 2019 corresponding to Chinese application No. 201810478541.3.

*Primary Examiner* — Joe H Cheng
(74) *Attorney, Agent, or Firm* — Nath, Goldberg & Meyer; Joshua B. Goldberg

(57) ABSTRACT

The present disclosure provides a deformation driving device for flexible display panel, the deformation driving device includes a photodeformable element, and the flexible display panel includes a display surface and a back surface opposite to the display surface. The photodeformable ele-
(Continued)

ment has a binding surface for being attached to the flexible display panel's back surface, and is capable of deforming under irradiation of light with a predetermined wavelength to bend or flatten.

18 Claims, 9 Drawing Sheets

(51) Int. Cl.
    *H05K 5/00*           (2006.01)
    *B81B 3/00*           (2006.01)
    *H10N 30/853*       (2023.01)
    *G09F 9/30*           (2006.01)

(52) U.S. Cl.
    CPC ......... *H10N 30/8554* (2023.02); *G09F 9/301* (2013.01); *G09G 2380/02* (2013.01)

(56) References Cited

U.S. PATENT DOCUMENTS

| | | | |
|---|---|---|---|
| 2015/0242056 A1* | 8/2015 | Hoffman | G06F 3/0416 345/175 |
| 2016/0195902 A1 | 7/2016 | Huh et al. | |
| 2018/0239214 A1* | 8/2018 | Ji | G02F 1/293 |

FOREIGN PATENT DOCUMENTS

| | | |
|---|---|---|
| CN | 106875850 A | 6/2017 |
| CN | 106910432 A | 6/2017 |
| CN | 206774158 U | 12/2017 |
| CN | 107633773 A | 1/2018 |
| CN | 108711371 A | 10/2018 |

\* cited by examiner

DEFORMATION DRIVING DEVICE FOR FLEXIBLE DISPLAY PANEL, AND FLEXIBLE DISPLAY DEVICE

CROSS REFERENCE TO RELATED APPLICATIONS

This is a National Phase Application filed under 35 U.S.C. 371 as a national stage of PCT/CN2019/086031, filed on May 8, 2019, an application claiming the priority of Chinese Patent Application No. 201810478541.3 filed on May 18, 2018, the disclosure of which is incorporated herein by reference.

TECHNICAL FIELD

The present disclosure relates to the field of display devices, and in particular, to a deformation driving device for a flexible display panel, and a flexible display device.

BACKGROUND

With the development of science and technology, flexible display technology has developed very fast in recent years, and various development plans of flexible display screens have been proposed endlessly and relate to a plurality of technical fields, such as display field, and wearable field. Flexible display has stretchable capability. At present, deformation of flexible screens is mainly driven by mechanical structures or by users manually.

SUMMARY

The present disclosure provides a deformation driving device for a flexible display panel, the deformation driving device includes a photodeformable element, the flexible display panel includes a display surface, and a back surface opposite to the display surface, and the photodeformable element has a binding surface for being attached to the back surface, and is capable of deforming under irradiation of light with a predetermined wavelength, so as to bend or flatten.

In some embodiments, the deformation driving device further includes at least one restraining member disposed on at least one side surface of the photodeformable element and configured to restrain deformation of the photodeformable element in a length direction of the photodeformable element.

In some embodiments, the photodeformable element includes a plurality of deformation portions, and the deformation driving device includes a plurality of restraining members, each of which is disposed on at least one side surface of a corresponding one of the plurality of deformation portions.

In some embodiments, the plurality of deformation portions include at least one first deformation portion arranged along a first direction, and at least one second deformation portion arranged along a second direction different from the first direction, the plurality of restraining members include a plurality of first restraining members and at least one second restraining member, a first side surface of each of the at least one first deformation portion and the at least one second deformation portion is provided with a corresponding one of the plurality of first restraining members, the at least one second restraining member is disposed on a second side surface of each of the at least one first deformation portion and the at least one second deformation portion, with the second side surface being opposite to the first side surface, and the first side surface and the second side surface are opposite to each other along a length direction of each of the at least one first deformation portion and the at least one second deformation portion.

In some embodiments, the plurality of restraining members include one second restraining member, which includes a bottom surface attached to the back surface of the flexible display panel and a plurality of side surfaces surrounding the bottom surface; and the second side surface of each of the at least one first deformation portion and the at least one second deformation portion is attached to a corresponding one of the plurality of side surfaces of the one second restraining member.

In some embodiments, the plurality of deformation portions include two first deformation portions and two second deformation portions, and the first direction is perpendicular to the second direction.

In some embodiments, the one second restraining member is a rectangular block including a bottom surface attached to the back surface of the display panel and four side surfaces surrounding the bottom surface.

In some embodiments, the photodeformable element includes a first light source layer, a first photodeformable layer, a second photodeformable layer, and a second light source layer, which are sequentially stacked along a thickness direction toward the binding surface of the photodeformable element; and the first light source layer is capable of emitting light toward the first photodeformable layer, and the second light source layer is capable of emitting light toward the second photodeformable layer.

In some embodiments, the first photodeformable layer is configured to protrude toward a side close to the first light source layer in a case where the first photodeformable layer is irradiated with the light from the first light source layer; and the second photodeformable layer is configured to protrude toward a side close to the second light source layer in a case where the second photodeformable layer is irradiated with the light from the second light source layer.

In some embodiments, each of a material of the first photodeformable layer and a material of the second photodeformable layer includes piezoelectric ceramics.

In some embodiments, the first light source layer and the second light source layer are capable of emitting ultraviolet light.

The present disclosure provides a flexible display device including a flexible display panel, and the flexible display panel includes a display surface and a back surface opposite to the display surface, and further includes at least one deformation driving device as described in the present disclosure, with the binding surface attached to the back surface of the flexible display panel.

In some embodiments, the flexible display device includes a plurality of deformation driving devices arranged in rows and columns, and the flexible display panel is not deformed in a case where the binding surfaces of the photodeformable elements of all of the plurality of deformation driving devices are flush with one another; and the flexible display panel is deformed in a case where at least part of the photodeformable element of any one of the plurality of deformation driving devices bends.

In some embodiments, each of the plurality of deformation driving devices is the deformation driving device as described in the present disclosure, and the flexible display device further includes a light emission driving circuit, which is coupled to both of the first light source layer and the second light source layer of each of the plurality of photodeformable elements, and configured to supply a driving voltage to the first light source layer and the second light source layer to cause the first light source layer and the second light source layer to emit light.

In some embodiments, each of the plurality of deformation driving devices is the deformation driving device as described in the present disclosure, and the flexible display device further includes a plurality of light emission driving circuits, each of which is respectively coupled to both of the first light source layer and the second light source layer of a corresponding one of the plurality of photodeformable elements, such that each of the plurality of photodeformable elements is individually supplied with a driving voltage to emit light.

In some embodiments, the light emission driving circuit includes a filter capacitor. In some embodiments, the flexible display device further includes a scenario trigger device capable of outputting a scenario trigger instruction, and the scenario trigger instruction is capable of triggering action of at least one of the deformation driving devices at a predetermined position, such that the flexible display panel is formed into a shape corresponding to the scenario trigger instruction.

In some embodiments, the scenario trigger device is capable of being remotely controlled.

BRIEF DESCRIPTION OF THE DRAWINGS

The accompanying drawings are provided for further understanding of the present disclosure, and are incorporated in and constitute a part of the specification, and are intended to explain the present disclosure together with specific embodiments below, but do not make any limitation to the present disclosure. In the drawings.

DETAILED DESCRIPTION

Figure 1:
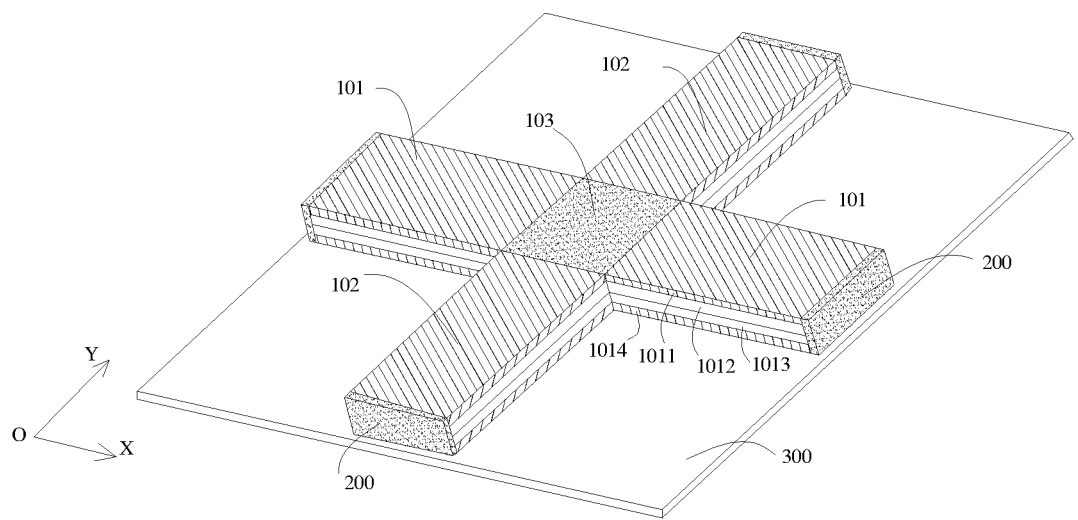
FIG. 1 is a schematic diagram of a deformation driving device according to an embodiment of the present disclosure, with a photodeformable element included in the deformation driving device in a flattened state.

Specific embodiments of the present disclosure will be described in detail below with reference to the accompanying drawings. It should be understood that the specific embodiments described herein are merely for illustrating and explaining the present disclosure, but do not make any limitation to the present disclosure.

At present, deformation of flexible screens is mainly driven by mechanical structures or by users manually. Due to their large volumes, the mechanical structures are hard to satisfy the requirements for lightness ad thinness of display devices. In addition, since degrees of freedom of deformation achieved by the mechanical driving structures are limited, deformation postures of the flexible screen, which can be realized when the flexible screen is driven by the mechanical structure to deform, are also limited, and therefore, cannot satisfy users' requirements.

As an aspect of the present disclosure, a deformation driving device for a flexible display panel is provided, the deformation driving device includes a photodeformable element, the flexible display panel includes a display surface and a back surface opposite to the display surface, the photodeformable element has a binding surface for being attached to the back surface of the flexible display panel, and the photodeformable element can deform under irradiation of light with a predetermined wavelength, so as to bend or flatten.

As described above, the deformation driving device provided by the present disclosure is applied to a flexible display panel, and can achieve multi-degree-of-freedom active deformation and ultra-thin design of the flexible display panel.

Specifically, the deformation driving device includes a photodeformable element having a binding surface, the binding surface is attached to the back surface of the flexible display panel, and the photodeformable element deforms after being irradiated with light with a predetermined wavelength. Deformation refers to bending or flattening of the photodeformable element. Since the binding surface of the photodeformable element is attached to the flexible display panel, when the photodeformable element deforms after being irradiated with the light with the predetermined wavelength, the flexible display panel deforms along with the photodeformable element.

The photodeformable element can realize multi-degree-of-freedom deformation postures when deforming, and can realize smooth transition among different deformation postures, so that the flexible display panel can realize multi-degree-of-freedom deformation postures and smooth transition among different deformation postures when the photodeformable element is applied to the flexible display panel, which makes a display interface more friendly, and improves user experience.

Furthermore, the deformation driving device further includes at least one restraining member disposed on at least one side surface of the photodeformable element and configured to restrain deformation of the photodeformable element in a length direction.

Specifically, the deformation driving device further includes at least one restraining member attached to at least one side surface of the photodeformable element, there is an angle between the side surface and the binding surface, and therefore, there is an angle between the restraining member and the binding surface, so that one surface of the restraining member in a thickness direction is fixedly coupled with the flexible display panel; and the restraining member is configured to restrain material flow of the photodeformable element, so that a length of the binding surface attached to the display panel is not changed after the photodeformable element bends and deforms, while a thickness of the photodeformable element is changed, thereby ensuring that the flexible display panel will not be elongated.

It should be noted that, the deformation driving device is small in size, and thus is easier to realize ultra-thin design of the flexible display panel in comparison with large mechanical structures in the prior art.

In summary, the deformation driving device for a flexible display panel provided by the present disclosure includes a photodeformable element, the flexible display panel includes a display surface and a back surface opposite to the display surface, the photodeformable element is attached to the back surface of the flexible display panel, and when the photodeformable element is deformed to bend or flatten after being irradiated with light with a predetermined wavelength, the flexible display panel deforms along with the photodeformable element, so as to achieve multi-degree-of-freedom active deformation and ultra-thin design of the flexible display panel.

In the present disclosure, the photodeformable element includes a plurality of deformation portions, and the deformation driving device includes a plurality of restraining members, each of which is disposed on at least one side surface of a corresponding one of the plurality of deformation portions; the plurality of deformation portions include at least one first deformation portion arranged along a first direction, and at least one second deformation portion arranged along a second direction different from the first direction, the plurality of restraining members include a plurality of first restraining members and at least one second restraining member, a first side surface of each of the at least one first deformation portion and the at least one second deformation portion is provided with a corresponding one of the plurality of first restraining members, the at least one second restraining member is disposed on a second side surface of each of the at least one first deformation portion and the at least one second deformation portion, with the second side surface being opposite to the first side surface, and the first side surface and the second side surface are opposite to each other along a length direction of each of the at least one first deformation portion and the at least one second deformation portion.

As described above, the photodeformable element can achieve multi-degree-of-freedom deformation with the above configuration.

Furthermore, by providing the plurality of first restraining members and the at least one second restraining member, the corresponding side surfaces of the deformation portions are restrained, so as to prevent the side surfaces from deforming when the deformation portions deform.

It should be noted that, for the plurality of deformation portions, the bending deformation under the light irradiation is plastic deformation. Since the first restraining members and the at least one second restraining member are correspondingly arranged on the opposite side surfaces in the length directions, material flow in the length directions is restrained, so that lengths of the surfaces attached to the display panel are not changed after the surfaces bend and deform, while thicknesses are changed, thereby ensuring that the flexible display panel will not be elongated.

In the present disclosure, the plurality of restraining members include one second restraining member including a bottom surface attached to the back surface of the flexible display panel and a plurality of side surfaces surrounding the bottom surface; and the second side surface of each of the at least one first deformation portion and the at least one second deformation restraining member is attached to a corresponding one of the plurality of side surfaces of the one second restraining member. The bottom surface (e.g. a neutral surface) of the second restraining member is located on the same side as the binding surface of the deformation portion (i.e., the bottom surface and the binding surface are flush with each other), and furthermore, the bottom surface is also attached to the back surface of the flexible display panel to fix the second restraining member, so as to restrain the deformation portion.

Figure 2:
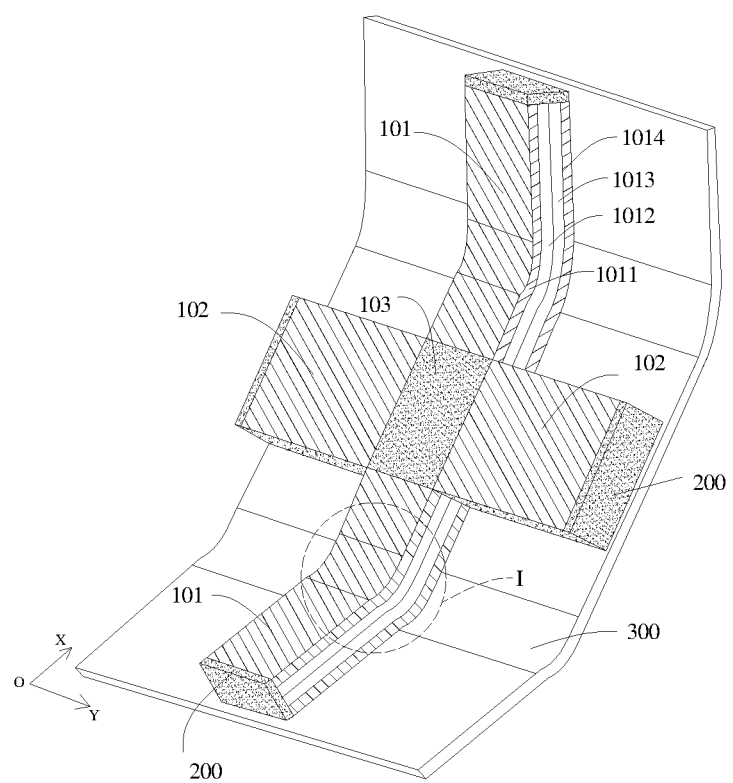
FIG. 2 is a schematic diagram of a deformation driving device according to an embodiment of the present disclosure, with the photodeformable element in a deformed state.

FIG. 1 is a schematic diagram of a deformation driving device according to an embodiment of the present disclosure, with a photodeformable element included in the deformation driving device being in a flattened state. FIG. 2 is a schematic diagram of a deformation driving device according to an embodiment of the present disclosure, with a photodeformable element being in a deformed state.

As an embodiment of the present disclosure, as shown in FIGS. 1 and 2, the deformation driving device includes a photodeformable element 100 including two lateral deformation portions 101 and two longitudinal deformation portions 102. As shown in FIGS. 1 and 2, a flexible display panel 300 is also shown. In FIG. 1, a lower surface of the flexible display panel is a display surface, and an upper surface is a back surface opposite to the display surface.

Specifically, the deformation driving device further includes a restraining block 103. A binding surface of the photodeformable element for being attached to the back surface of the flexible display panel includes lateral binding surfaces formed on the lateral deformation portions 101 and longitudinal binding surfaces formed on the longitudinal deformation portions 102, the two lateral deformation portions 101 are disposed apart from each other along a length direction thereof (an example of the first direction), the two longitudinal deformation portions 102 are disposed apart from each other along a length direction thereof (an example of the second direction), and the length direction of the lateral deformation portions 101 intersects (in this embodiment, is perpendicular to) the length direction of the longitudinal deformation portions 102. The restraining block 103 (an example of the second restraining member) includes a bottom surface attached to the back surface of the display panel and a plurality of side surfaces surrounding the bottom; one side surface of the lateral deformation portion 101 in the length direction thereof is attached to one side surface of the restraining block 103, one side surface of the longitudinal deformation portion 102 in the length direction thereof is attached to the other side surface of the restraining block 103, and each of the other side surface of the lateral deformation portion 101 in the length direction thereof and the other side surface of the longitudinal deformation portion 102 in the length direction thereof is provided with a restraining member 200 (an example of the first restraining member), as shown in FIGS. 1 and 2.

The deformation driving device of the present disclosure is not limited to be implemented in the manner described in the above embodiment, and may also be implemented in manners according to other embodiments. Without departing from the spirit and scope of the present disclosure, all manners of implementing the deformation driving device should be considered to fall within the scope of the present disclosure.

In other embodiments of the present disclosure, the deformation portion and the restraining block may be arranged in other ways. For example, a plurality of deformation portions are provided, and the plurality of deformation portions include at least one first deformation portion arranged along a first direction and at least one second deformation portion arranged along a second direction different from the first direction; a restraining block is provided, and the restraining block includes a plurality of side surfaces (e.g. five or six or more side surfaces), a corresponding side surface of each of the at least one first deformation portion and the at least one second deformation portion is attached to a corresponding one of the plurality of side surfaces of the restraining block, which may increase degrees of freedom of deformation of the display panel. In other embodiments of the present disclosure, only the restraining member 200 may be provided to restrain the photodeformable element. In other embodiments of the present disclosure, the photodeformable element is not limited to the above shape, and may be provided in other shapes. In the drawings, the restraining member 200 is formed in a sheet shape, but the present disclosure is not limited thereto.

It should be noted that, taking FIGS. 1 and 2 as an example, an X-axis direction represents the length direction of the lateral deformation portions 101, and a Y-axis direction represents the length direction of the longitudinal deformation portions 102, and the X-axis direction is perpendicular to the Y-axis direction. It should be noted that, the above FIGS. 1 and 2 are merely for facilitating understanding of the technical solutions of the present disclosure, but do not make any limitation to the present disclosure.

As described above, it is readily understood that the binding surface includes the lateral binding surfaces formed on the lateral deformation portions 101 and the longitudinal binding surfaces formed on the longitudinal deformation portions 102, and the lateral deformation portions 101 are attached to the back surface of the flexible display panel 300 through the lateral binding surfaces; and correspondingly, the longitudinal deformation portions 102 are attached to the back surface of the flexible display panel 300 through the longitudinal binding surfaces.

It should be noted that the back surface of the flexible display panel 300 refers to a surface opposite to the display surface of the flexible display panel 300.

As shown in FIGS. 1 and 2, the two lateral deformation portions 101 are arranged apart from each other along the length direction thereof, the two longitudinal deformation portions 102 are arranged apart from each other along the length direction thereof, and the length direction of the lateral deformation portions 101 intersects the length direction of the longitudinal deformation portions 102, so that a rectangular accommodating space for accommodating a restraining block 103 is formed between the two lateral deformation portions 101 and between the two longitudinal deformation portions 102. The restraining block 103 is placed in the accommodating space, and has four side surfaces, which are respectively attached to one side surface of the corresponding lateral deformation portion 101 in the length direction thereof or one side surface of the corresponding longitudinal deformation portion 102 in the length direction thereof, so that the restraining block 103 can achieve restraining the lateral deformation portions 101 or the longitudinal deformation portions 102. A bottom surface of the restraining block 103 is attached to the flexible display panel 300 to further enhance stability of the restraining block 103 in restraining the lateral deformation portions 101 or the longitudinal deformation portions 102.

An end of the lateral deformation portion 101, which is opposite to the end of the lateral deformation portion 101 in the length direction thereof attached to the side surface of the restraining block 103, is provided with a restraining sheet 200, so that the restraining sheet 200 can restrain the side surface of the lateral deformation portion 101 attached thereto, and prevent the side surface of the lateral deformation portion 101 from deforming when the lateral deformation portion 101 deforms, thereby ensuring that devices (such as a camera, and a battery) around the lateral deformation portions 101 will not be damaged due to extrusion, and service life of the flexible display panel 300 is prolonged.

Correspondingly, an end of the longitudinal deformation portion 102, which is opposite to the end of the longitudinal deformation portion 102 in the length direction thereof attached to the restraining block 103, is also provided with a restraining member 200, which can produce the same technical effects as those in the lateral deformation portion 101, and thus will not be repeated herein.

In the above embodiment, FIG. 1 shows that the photodeformable element is in a flattened state. In this case, the lateral binding surfaces of the two lateral deformation portions 101 and the longitudinal binding surfaces of the two longitudinal deformation portions 102 are flush with each other, and the flexible display panel 300 is not deformed.

FIG. 2 shows that the photodeformable element is in a deformed state. In this case, the deformed state of the photodeformable element indicates that the flexible display panel is deformed when at least part of the photodeformable element of any one of the plurality of deformation driving devices bends. Specifically, in this embodiment, the deformed state of the photodeformable element indicates that at least part of any one of the two lateral deformation portions 101 and the two longitudinal deformation portions 102 of each photodeformable element deforms (as shown in FIG. 2, two parts of the two lateral deformation portions 101 deform), so that the flexible display panel 300 is deformed.

Specifically, as shown in FIG. 2, the two lateral deformation portions 101 bend in a direction away from a display side of the flexible display panel 300, and the two longitudinal deformation portions 102 are kept in a flattened state, and in this case, the flexible display panel is bent toward the back surface of the flexible display panel 300 when observed from the display side of the flexible display panel 300, so as to realize one of the multi-degree-of-freedom deformation postures of the flexible display panel.

Figure 3:
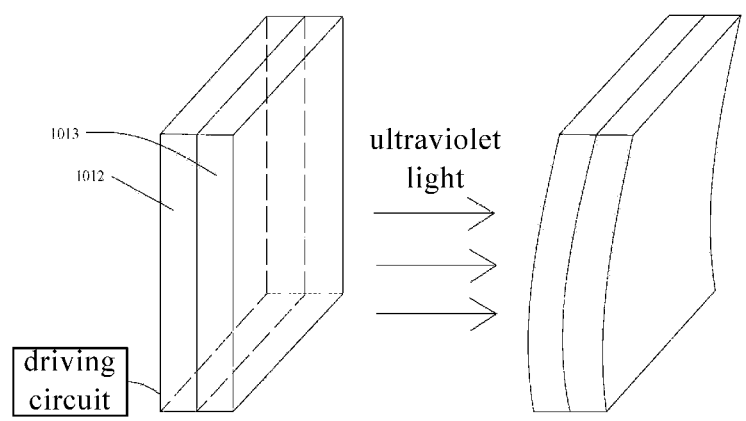
FIG. 3 is a schematic diagram illustrating that photodeformable layers deform after being irradiated with light according to an embodiment of the present disclosure.
Figure 4:
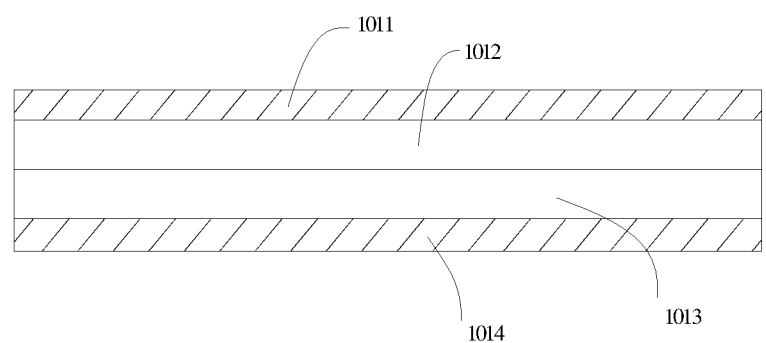
FIG. 4 is an enlarged schematic diagram of Part I of the deformation driving device provided in FIG. 1, which is in a flattened state.
Figure 5:
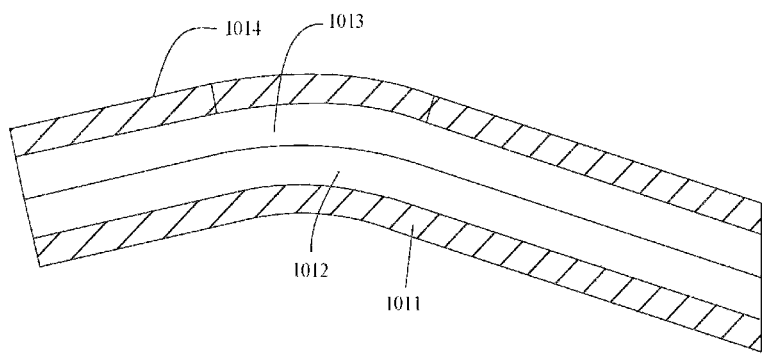
FIG. 5 is an enlarged schematic diagram of Part I of the deformation driving device provided in FIG. 2, which is in a deformed state.

FIG. 3 is a schematic diagram illustrating that photodeformable layers deform after being irradiated with light according to an embodiment of the present disclosure. FIG. 4 is an enlarged schematic diagram of a part of the deformation driving device provided in FIG. 1, which is in a flattened state. FIG. 5 is an enlarged schematic diagram of Part I of the deformation driving device provided in FIG. 2, which is in a deformed state.

Furthermore, in the present disclosure, as shown in FIGS. 1 to 5, the photodeformable element includes a first light source layer 1011, a first photodeformable layer 1012, a second photodeformable layer 1013, and a second light source layer 1014, which are sequentially stacked along a thickness direction toward the binding surface of the photodeformable element; and the first light source layer 1011 is capable of emitting light toward the first photodeformable layer 1012, and the second light source layer 1014 is capable of emitting light toward the second photodeformable layer 1013.

It should be noted that, taking FIGS. 1 and 2 as an example, the photodeformable element includes the lateral deformation portions 101 and the longitudinal deformation portions 102, the different reference numerals are only for showing a positional relationship between the lateral and longitudinal deformation portions, and the layer structures of the lateral deformation portion 101 and the longitudinal deformation portion 102 are the same as each other. Therefore, although it is only shown in FIGS. 1 and 2 that the lateral deformation portion 101 includes the first light source layer 1011, the first photodeformable layer 1012, the second photodeformable layer 1013, and the second light source layer 1014, which are sequentially stacked along the thickness direction toward the binding surface of the photodeformable element, the longitudinal deformation portion 102 also includes the first light source layer 1011, the first photodeformable layer 1012, the second photodeformable layer 1013, and the second light source layer 1014, which are sequentially stacked along a thickness direction toward the binding surface of the photodeformable element.

Furthermore, as shown in FIG. 3, the first photodeformable layer 1012 is attached to the second photodeformable layer 1013.

It should be noted that, when the first photodeformable layer 1012 is irradiated with the light from the first light source layer 1011, the first photodeformable layer 1012 protrudes toward a side close to the first light source layer 1011 and a backlight side of the first photodeformable layer 1012 does not protrude, so that the first photodeformable layer 1012 bends toward the backlight side, thereby causing the flexible display panel 300 to deform in a direction opposite to that shown in FIG. 2 (that is, the flexible display panel 300 is deformed to bend toward the display surface). Correspondingly, when the second photodeformable layer 1013 is irradiated with the light from the second light source layer 1014, the second photodeformable layer 1013 protrudes toward a side close to the second light source layer 1014, and a backlight side of the second photodeformable layer 1013 does not protrude, so that the second photodeformable layer 1013 bends toward the backlight side, thereby causing the flexible display panel 300 to deform in a direction as shown in FIG. 2 (that is, the flexible display panel 300 is deformed to bend toward the back surface).

Furthermore, it is readily understood that the first light source layer 1011 emits light toward the first photodeformable layer 1012 to drive the first photodeformable layer 1012 to deform (bend toward the backlight side thereof), thereby causing the flexible display panel 300 to deform to bend toward the display surface; and the second light source layer 1014 emits light toward the second photodeformable layer 1013 to drive the second photodeformable layer 1013 to deform (bend toward the backlight side thereof), thereby causing the flexible display panel 300 to deform to bend toward the back surface.

Based on the above working principles, when the first photodeformable layer 1012 deforms, the first photodeformable layer 1012 may be restored through deformation of the second photodeformable layer 1013; similarly, when the second photodeformable layer 1013 deforms, the second photodeformable layer 1013 may be restored through deformation of the first photodeformable layer 1012.

As an embodiment of the present disclosure, each of a material of the first photodeformable layer 1012 and a material of the second photodeformable layer 1013 may include piezoelectric ceramics. In an embodiment of the present disclosure, the piezoelectric ceramics may be lead lanthanum zirconate titanate (PLZT) piezoelectric ceramics.

In an embodiment of the present disclosure, a plurality of light emitting elements are provided in the first and second light source layers, so that the first and second light source layers are capable of emitting ultraviolet light.

The present disclosure provides a flexible display device including a flexible display panel, and the flexible display panel includes a display surface and a back surface opposite to the display surface, and further includes a deformation driving device as described in the present disclosure, with the binding surface attached to the back surface of the flexible display panel.

In an embodiment of the present disclosure, the flexible display device further includes a light emission driving circuit, which is coupled to both of the first and second light source layers of each of the plurality of photodeformable elements, and configured to supply a driving voltage to the first and second light source layers to cause the first and second light source layers to emit light.

In another embodiment of the present disclosure, the flexible display device further includes a plurality of light emission driving circuits, each of which is respectively coupled to both of the first and second light source layers of a corresponding one of the plurality of photodeformable elements, so that each of the plurality of photodeformable elements is individually supplied with a driving voltage to emit light.

Figure 6:
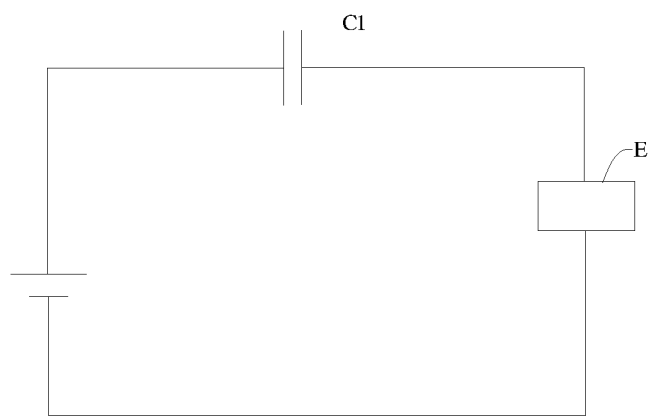
FIG. 6 is a schematic diagram illustrating a connection relationship between a driving circuit and a light emitting element according to the present disclosure.

Specifically, FIG. 6 is a schematic diagram illustrating a connection relationship between a driving circuit and a light emitting element according to the present disclosure. In the present disclosure, as shown in FIGS. 3 and 6, the flexible display device further includes a light emission driving circuit, which includes a power supply and a filter element, and is coupled to both of the first and second light source layers to supply a driving voltage (e.g. a direct current voltage or an alternating current voltage) to the first and second light source layers (e.g., each light emitting element in the first and second light source layers), so as to cause the first and second light source layers to emit light. In an embodiment of the present disclosure, the light emission driving circuit may provide respective driving voltages for the first and second light source layers as required, so as to cause the flexible display panel 300 to deform at corresponding positions in required ways.

As an embodiment of the present disclosure, as shown in FIG. 6, the light emission driving circuit includes a filter capacitor C1, and the light emitting element E may be an ultraviolet light emission core. In an embodiment of the present disclosure, there is one light emission driving circuit, which is coupled to each light emitting element and supplies a driving voltage thereto. In other embodiments of the present disclosure, there are a plurality of light emission driving circuits, each of which is respectively coupled to the light emitting elements of the light source layers of a corresponding photodeformable element, so that the light source layers of each photodeformable element is individually supplied with the driving voltage to emit light.

Figure 7:
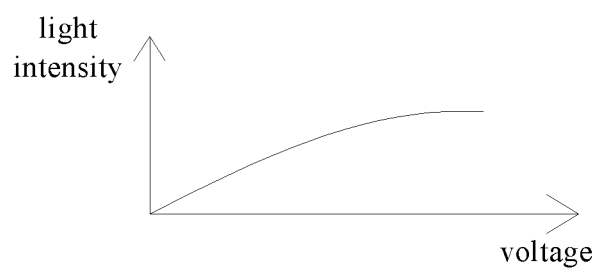
FIG. 7 is a graph illustrating a relationship between light intensity of a light emitting element and a value of voltage applied to the light emitting element according to an embodiment of the present disclosure.

FIG. 7 is a graph illustrating a relationship between light intensity of a light emitting element and a value of voltage applied to the light emitting element according to an embodiment of the present disclosure. FIG. 7 shows the relationship between intensity of light emitted from a light emitting element and a voltage applied to two terminals of the light emitting element. Specifically, within a rated power range of the light emitting element, the light intensity is increased along with an increase of the voltage; after the voltage reaches a certain value, the light intensity is not changed; and the higher the light intensity is, the larger a deformation amplitude of the photodeformable layers is, the larger a deformation amplitude of the flexible display panel is.

Figure 8:
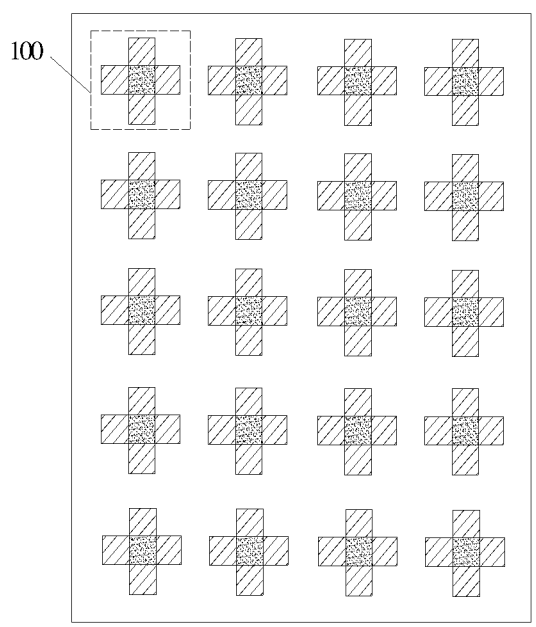
FIG. 8 is a schematic diagram of arranging a plurality of deformation driving devices according to another embodiment of the present disclosure.

FIG. 8 is a schematic diagram of arranging a plurality of deformation driving devices in a flexible display device according to another embodiment of the present disclosure. For the sake of simplicity, only photodeformable units 100 of the plurality of deformation driving devices are exemplarily shown FIG. 8, but the corresponding restraining members are not shown. As an embodiment of the present disclosure, as shown in FIG. 8, the flexible display device includes a plurality of deformation driving devices arranged in an array, that is, the plurality of deformation driving devices are arranged in rows and columns. When each photodeformable element in the plurality of deformation driving devices is in a flattened state, that is, all binding surfaces of the plurality of photodeformable elements are flush with one another, the flexible display panel 300 is not deformed. When at least part of the photodeformable element of any one of the plurality of deformation driving devices bends, that is, the photodeformable element is in a deformed state, the flexible display panel 300 is deformed. The deformation driving device of the present disclosure is not limited to be implemented in the manner described in the above embodiment, and may also be implemented in manners according to other embodiments. Without departing from the spirit and scope of the present disclosure, all manners of implementing the deformation driving device should be considered to fall within the scope of the present disclosure.

It is readily understood that, by arranging the plurality of deformation driving devices included in the flexible display device in an array, deformation accuracy of the flexible display panel may be improved. Specifically, as shown in FIG. 8, a plurality of deformation driving devices arranged in an array are arranged in 5 rows and 4 columns, and each photodeformable element 100 can realize a deformation posture as shown in FIG. 2 (it should be noted that the deformation postures that the photodeformable element 100 can realize are not limited thereto in the present disclosure). In a case where the deformation driving devices are arranged at the back surface of the flexible display panel, by controlling each photodeformable element 100 individually, multi-degree-of-freedom deformations of the flexible display panel may be realized to meet different shaping demands for a plurality of application scenarios, so as to satisfy user needs and improve user experience.

"Degree of freedom" refers to the number of deformation postures that the flexible display panel can realize, for example, one deformation posture is recorded as one degree of freedom.

As another aspect of the present disclosure, a flexible display device is provided, and the flexible display device includes a flexible display panel, the flexible display panel includes a display surface and a back surface opposite to the display surface, and further includes at least one deformation driving device provided by the present disclosure, with the binding surface attached to the back surface of the flexible display panel.

It is readily understood that, by adopting the deformation driving device provided by the present disclosure, the flexible display device does not need external restraining and shaping, and can realize multi-degree-of-freedom deformation.

Furthermore, in the present disclosure, the flexible display device further includes a scenario trigger device capable of outputting a scenario trigger instruction, and the scenario trigger instruction may be configured to trigger action of a deformation driving device at a predetermined position, so that the flexible display panel is formed into a shape corresponding to the scenario trigger instruction.

As described above, as an embodiment of the present disclosure, a scenario trigger instruction is generated and output by the scenario trigger device according to displayed contents, and can trigger action of a deformation driving device at a predetermined position.

Figure 9:
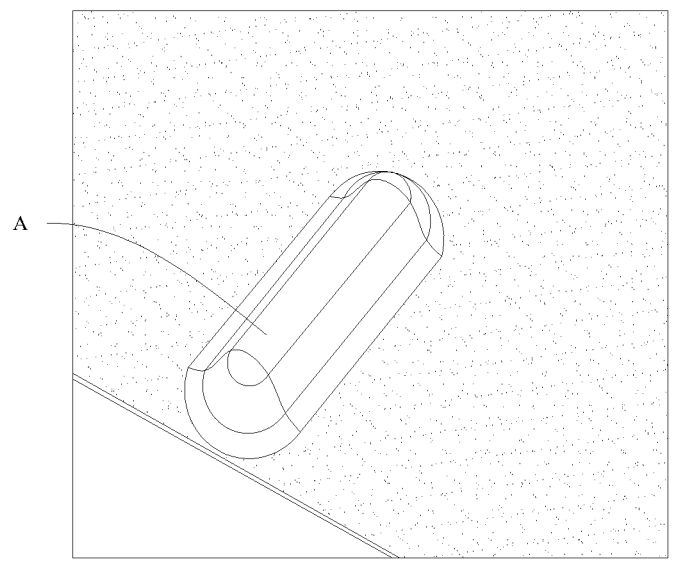
FIG. 9 is a schematic diagram illustrating an embodiment of operation of a flexible display device according to the present disclosure.

FIG. 9 is a schematic diagram illustrating an embodiment of operation of a flexible display device according to the present disclosure. For example, as shown in FIG. 9, in a case where the flexible display device is to display a map, corresponding deformation driving devices may be controlled via the scenario trigger instructions in such a way that the deformation driving devices are driven to protrude at positions of mountains of the map, so as to drive the flexible display panel to protrude (Area A represents a protruding mountain on the flexible display panel), and the deformation driving devices are driven to sink at positions of basins of the map, so as to drive the flexible display panel to sink (not shown in FIG. 9).

In other embodiments, in a case where the flexible display device displays with music, it may be formed into different shapes according to the music.

As an embodiment of the present disclosure, the scenario trigger device generates and outputs a scenario trigger instruction under remote control, and the scenario trigger instruction can trigger action of a deformation driving device at a predetermined position, which makes the flexible display device more convenient. For example, when a user sends a deformation parameter instruction to the scenario trigger device for causing the deformation driving devices to deform in a required way, the scenario trigger device generates and outputs scenario trigger instructions after receiving the deformation parameter instruction, so as to trigger action of the deformation driving devices at predetermined positions, and finally adjust the flexible display panel to a deformation posture required by the user.

It should be understood that the above embodiments are merely exemplary embodiments employed to illustrate the principles of the present disclosure, and the present disclosure is not limited thereto. Without departing from the spirit and essence of the present disclosure, various changes and modifications can be made by those skilled in the art, and should be considered to fall within the protection scope of the present disclosure.

What is claimed is:

1. A deformation driving device for a flexible display panel, the deformation driving device comprising a photodeformable element, the flexible display panel comprising a display surface and a back surface opposite to the display surface,
   wherein the photodeformable element has a binding surface for being attached to the back surface, and is capable of deforming under irradiation of light with a predetermined wavelength to bend or flatten, and
   wherein the deformation driving device further comprises at least one restraining member on at least one side surface of the photodeformable element and configured to restrain deformation of the photodeformable element in a length direction of the photodeformable element.

2. The deformation driving device of claim 1, wherein the photodeformable element comprises a plurality of deformation portions, and the deformation driving device comprises a plurality of restraining members, each of the plurality of restraining members being on at least one side surface of a corresponding one of the plurality of deformation portions.

3. The deformation driving device of claim 2, wherein the plurality of deformation portions comprise at least one first deformation portion arranged along a first direction, and at least one second deformation portion arranged along a second direction different from the first direction, the plurality of restraining members comprise a plurality of first restraining members and at least one second restraining member, wherein a first side surface of each of the at least one first deformation portion and the at least one second deformation portion is provided with a corresponding one of the plurality of first restraining members, and the at least one second restraining member is on a second side surface of each of the at least one first deformation portion and the at least one second deformation portion, with the second side surface being opposite to the first side surface, wherein the first side surface and the second side surface are opposite to each other along a length direction of each of the at least one first deformation portion and the at least one second deformation portion.

4. The deformation driving device of claim 3, wherein the plurality of restraining members comprise one second restraining member, the second restraining member comprises a bottom surface attached to the back surface of the flexible display panel and a plurality of side surfaces surrounding the bottom surface, and the second side surface of each of the at least one first deformation portion and the at least one second deformation portion is attached to a corresponding one of the plurality of side surfaces of the one second restraining member.

5. The deformation driving device of claim 4, wherein the plurality of deformation portions comprise two first deformation portions and two second deformation portions, and bottom wherein the first direction is perpendicular to the second direction.

6. The deformation driving device of claim 5, wherein the one second restraining member is a rectangular block comprising a surface attached to the back surface of the flexible display panel and four side surfaces surrounding the bottom surface.

7. A flexible display device, comprising a flexible display panel, wherein the flexible display panel comprises a display surface and a back surface opposite to the display surface, and further comprises at least one deformation driving device of claim 1, with the binding surface attached to the back of the flexible display panel.

8. The flexible display device of claim 7, comprising a plurality of deformation driving devices arranged in rows and columns, the flexible display panel is not deformed in a case where the binding surfaces of the photodeformable elements of all of the plurality of deformation driving devices are flush with one another, and the flexible display panel is deformed in a case where at least part of the photodeformable element of any one of the plurality of deformation driving devices bends.

9. The flexible display device of claim 8, wherein each of the plurality of deformation driving devices is a deformation driving device for a flexible display panel, the deformation driving device comprising a photodeformable element, the flexible display panel comprising a display surface and a back surface opposite to the display surface, wherein the photodeformable element has a binding surface for being attached to the back surface, and is capable of deforming under irradiation of light with a predetermined wavelength to bend or flatten, wherein the photodeformable element comprises a first light source layer, a first photodeformable layer, a second photodeformable layer, and a second light source layer sequentially stacked along a thickness direction toward the binding surface of the photodeformable element, and the first light source layer is capable of emitting light toward the first photodeformable layer, and the second light source layer is capable of emitting light toward the second photodeformable layer, and the flexible display device further comprises a light emission driving circuit, which is coupled to both of the first light source layer and the second light source layer of each of the plurality of photodeformable elements, and configured to supply a driving voltage to the first light source layer and the second light source layer to cause the first light source layer and the second light source layer to emit light.

10. The flexible display device of claim 9, wherein the light emission driving circuit comprises a filter capacitor.

11. The flexible display device of claim 8, wherein each of the plurality of deformation driving devices is a deformation driving device for a flexible display panel, the deformation driving device comprising a photodeformable element, the flexible display panel comprising a display surface and a back surface opposite to the display surface, wherein the photodeformable element has a binding surface for being attached to the back surface, and is capable of deforming under irradiation of light with a predetermined wavelength to bend or flatten, wherein the photodeformable element comprises a first light source layer, a first photodeformable layer, a second photodeformable layer, and a second light source layer sequentially stacked along a thickness direction toward the binding surface of the photodeformable element, and the first light source layer is capable of emitting light toward the first photodeformable layer, and the second light source layer is capable of emitting light toward the second photodeformable layer, and the flexible display device further comprises a plurality of light emission driving circuits, each of the plurality of light emission driving circuits is respectively coupled to both of the first light source layer and the second light source layer of a corresponding one of the plurality of photodeformable elements, such that each of the plurality of photodeformable elements is individually supplied with a driving voltage to emit light.

12. The flexible display device of claim 8, further comprising a scenario trigger device capable of outputting a scenario trigger instruction, and the scenario trigger instruction is capable of triggering action of at least one of the deformation driving devices at a predetermined position, such that the flexible display panel is formed into a shape corresponding to the scenario trigger instruction.

13. The flexible display device of claim 12, wherein the scenario trigger device is capable of being remotely controlled.

14. A flexible display device, comprising a flexible display panel, wherein the flexible display panel comprises a display surface and a back surface opposite to the display surface, and further comprises at least one deformation driving device of claim 2, with the binding surface attached to the back of the flexible display panel.

15. A deformation driving device for a flexible display panel, the deformation driving device comprising a photodeformable element, the flexible display panel comprising a display surface and a back surface opposite to the display surface, wherein the photodeformable element has a binding surface for being attached to the back surface, and is capable of deforming under irradiation of light with a predetermined wavelength to bend or flatten, wherein the photodeformable element comprises a first light source layer, a first photodeformable layer, a second photodeformable layer, and a second light source layer sequentially stacked along a thickness direction toward the binding surface of the photodeformable element, and the first light source layer is capable of emitting light toward the first photodeformable layer, and the second light source layer is capable of emitting light toward the second photodeformable layer.

16. The deformation driving device of claim 15, wherein the first photodeformable layer is configured to protrude toward a side close to the first light source layer in a case where the first photodeformable layer is irradiated with the light from the first light source layer, and the second photodeformable layer is configured to protrude toward a side close to the second light source layer in a case where the second photodeformable layer is irradiated with the light from the second light source layer.

17. The deformation driving device of claim 15, wherein each of a material of the first photodeformable layer and a material of the second photodeformable layer comprises piezoelectric ceramics.

18. The deformation driving device of claim 15, wherein the first light source layer and the second light source layer are capable of emitting ultraviolet light.

* * * * *